United States Patent [19]
Zak

[11] Patent Number: 5,771,157
[45] Date of Patent: Jun. 23, 1998

[54] CHIP-ON-BOARD PRINTED CIRCUIT ASSEMBLY USING ALUMINUM WIRE BONDED TO COPPER PADS

[75] Inventor: Robert L. Zak, St. Paul, Minn.

[73] Assignee: Honeywell, Inc., Minneapolis, Minn.

[21] Appl. No.: 611,594

[22] Filed: Mar. 8, 1996

[51] Int. Cl.$^6$ ..................................................... H05K 1/18
[52] U.S. Cl. .......................... 361/760; 361/772; 361/771; 361/777; 361/779; 361/783; 174/251; 174/259; 174/260; 174/52.2; 174/52.3; 257/723; 257/724; 257/786; 257/784; 257/787; 257/788; 257/793; 228/123.1
[58] Field of Search .................................... 361/760, 772, 361/771, 777, 779, 783; 174/251, 259, 260, 52.2, 52.3; 257/723, 724, 786, 784, 787, 788, 793; 228/123.1

[56] References Cited

U.S. PATENT DOCUMENTS

| 4,501,787 | 2/1985 | Marchetti et al. | 442/232 |
| 5,313,365 | 5/1994 | Pennisi et al. | 361/760 |
| 5,410,181 | 4/1995 | Zollo et al. | 257/681 |

*Primary Examiner*—Leo P. Picard
*Assistant Examiner*—David Foster
*Attorney, Agent, or Firm*—Edward L. Schwarz

[57] ABSTRACT

A printed circuit board carries a microcircuit package electrically connected to bare copper connector pads on the printed circuit board microcircuit package by aluminum wires. The copper connection pads are encapsulated by a material such as low stress liquid encapsulant having a thermal expansion coefficient approximately equal to that of the printed circuit board substrate material. Preferably the printed circuit board laminate comprises cellulose epoxy mat such as CEM-1.

8 Claims, 4 Drawing Sheets

CHIP-ON-BOARD PRINTED CIRCUIT ASSEMBLY USING ALUMINUM WIRE BONDED TO COPPER PADS

BACKGROUND OF THE INVENTION

It is well known that microcircuits are intricate and delicate articles whose performance depends on maintaining the functions provided by extremely small circuit features. Reliable operation depends on protecting the entire microcircuit from environmentally caused harm arising from sources such as mechanical damage, corrosion caused by moisture and airborne chemical vapors, and particulate contamination. This invention provides for lower manufacturing cost of printed circuit board assemblies using a known type of structure for protecting individual microcircuits from damage arising from environmental sources after manufacturing is done. The invention does not compromise either the level of protection or the operating characteristics.

Microcircuits are most frequently formed on a silicon wafer by photolithographic processes. Typically there will be hundreds of individual microcircuits formed by a series of photolithographic steps. After the photolithographic process steps are completed and the microcircuits have been formed, the wafer is sliced by a diamond saw to form a number of small dice, each carrying (usually) a single microcircuit. In the manufacturing process, small connection pads around the periphery of the actual circuit are formed as a part of the microcircuit's conductors, and these are present on the individual dice. Thin wires are bonded to these connection pads and to other pads off the die itself for connecting the microcircuit to other devices which provide signals and power to the microcircuit, or use the signals which the microcircuit generates. As is well known of course, microcircuits are usually mounted on and electrically connected to a printed circuit board. Depending on its type there will be as many as several hundred individual connections from a microcircuit to the circuit board on which it is mounted.

The need to protect individual microcircuits from external damage was mentioned above. This protection can be provided by enclosing the microcircuit within a package of some type. When such a package is used, it will have external pins or pads of some kind which are internally connected to the microcircuit, and by which the microcircuit makes its external connections. These connections can take a variety of forms. Pins or legs extending from the package surface can be connected to printed circuit wiring either by soldering or by mounting in a permanent socket mounted on the printed circuit board. External connection pads are usually placed around the outer edge of the package; these also can either be soldered to properly positioned pads on the printed circuit board, or the entire package can be inserted in a socket which has spring contacts which press against the pads. A socket is used where it may be desirable to remove the microcircuit from the circuit board at a later time.

While pre-packaging microcircuits in individual packages during the initial manufacturing process makes them easy to ship and mount, there are some disadvantages. In the first place at least one extra connection for each microcircuit pad is required. Secondly, additional area on a printed circuit board must be allotted for each microcircuit package, which is a problem if space constraints are important. Thirdly, the additional steps in the mounting process may add to the cost. That is, other things being equal, the microcircuit mounting part of the process involves additional steps in mounting the individual microcircuit in the package, and then mounting the package itself on the printed circuit board. Each of these process steps is likely to add cost and reduce yield/reliability. Eliminating any of these steps has the potential to reduce cost and increase yield. Accordingly, there has been motivation to develop a means of microcircuit connection which omits as a part of the microcircuit manufacturing process, the step of packaging individual microcircuits.

This alternate type of microcircuit connection has been realized in the process known as chip-on-board (COB) surface mounting. Briefly, in this process a die cut conventionally from a wafer and carrying a completed microcircuit with exposed connection pads is mechanically attached to a printed circuit board, typically with an adhesive. Then leads are attached between the microcircuit's connection pads and the corresponding pads on the circuit board. Lastly, some type of mechanical protection for the microcircuit and the leads is applied. The COB process as presently practiced mounts a microcircuit in perhaps 30–50% less area on the printed circuit board than the same microcircuit when mounted as pre-packaged component. This is an important advantage because the application may not permit a larger printed circuit board and in any case, a smaller board is cheaper.

There is a definitive discussion of the COB process in the publication ANSI/IPC-SM-784, Guidelines for Chip-on-Board Technology Implementation, dated November 1990, and available from the Institute for Interconnecting and Packaging Electronic Circuits, 7380 N. Lincoln Ave., Lincolnwood, Ill. 60646 (hereafter "the Guidelines"). The remainder of this disclosure assumes the reader to be familiar with the Guidelines.

The printed circuit board used in COB mounting may be made either from an inorganic material such as a ceramic, or from an epoxy or other organic material. Because organic printed circuit boards are cheaper, it is preferred to use them unless some special factor requires use of inorganic printed circuit boards. Of the organic materials used for printed circuit boards, cellulose epoxy mat (CEM) is among the least expensive, but is also among the most sensitive to heat. A designation for a type of generic CEM board material is CEM-1. 100% epoxy mat is a more expensive board material that has advantages where conductor paths on both sides are necessary. FR-4 is a generic term for 100% epoxy mat. Because of its low price and generally good performance, CEM is usually preferred if compatible with the manufacturing processes required and the usage expected. CEM and 100% epoxy mat boards have a foil layer from which are etched the conductors which electrically connect the components carried on the board. Most often, the foil layer is formed of copper because of its outstanding electrical and heat conductivity. Areas of the foil conductors form connection pads to which the wires from the microcircuits are attached.

The Guidelines describe three different connection processes for electrically connecting the die's connection pads to the printed circuit board pads. These are thermocompression, thermosonic, and ultrasonic wire bonding. These processes rely on at least one of pressure, heat and vibration to form a bond between individual wires and pads. The Guidelines explain these processes and their advantages and disadvantages. Briefly, which of these processes to use in a particular situation depends on a number of factors, such as the number of interconnections to be made, the reliability required, the type of use to which the printed circuit board will be put, the density of the microcircuits on the board, etc.

Ultrasonic bonding, also called wedge bonding, is often preferred because it is overall the cheapest, under the proper conditions it makes a very satisfactory connection, and it does not rely on external heating of the parts. Wedge bonding uses a wedge-shaped bonding tool to press the wire strongly against the pad. High frequency acoustic energy without external heat is then applied to the bonding tool which vibrates the wire against the pad to form a mechanical and electrical bond between the wire and the pad. Aluminum wire is customary for use when wedge bonding as usually forming both cheaper and better bonds than gold, the other wire commonly used for chip connection.

Wedge bonding of aluminum wire to the aluminum die pads formed during the photolithographic steps of microcircuit manufacture is a widely accepted technique. The pads on the printed circuit board to which the die pads are electrically connected are part of the copper foil which is etched to form the printed circuit conductor paths on the board. It is known to be quite difficult to consistently form acceptable bonds between aluminum wire and copper pads. For this reason, the Guidelines, p. 11, specify that the copper foil on the printed circuit board must have a gold over nickel coating to create a surface to which the aluminum wire will form an acceptable bond. Even though most of the copper foil and the gold layer on it is removed during the etching process, it is customary to plate the nickel and gold layers on the foil before it is attached to the printed circuit board. The use of the nickel and gold layers allows a good electrical and mechanical connection between the aluminum wire and the copper foil, but the cost of the gold plating on the copper foil is a disadvantage of COB mounting.

I am not familiar with the metallurgical factors which influence those skilled in art to apply the gold and nickel layers to the copper foil before the bonding step. I suspect that yields may suffer and even that longevity of the bond may decrease when the gold and nickel layers are not present. *Transactions on Components, Hybrids, and Manufacturing Technology,* vol. CHMT-7, No. 4, December, 1984, Effects of Ambient Atmosphere on Aluminum-Copper Wirebond Reliability, by Dennis R. Olsen et al. discusses a mechanism by which the wedge bonded interface between an aluminum wire and a bare copper surface deteriorates over time in a vacuum, but appears to have a relatively long life in the presence of air. The received wisdom with respect to wedge bonding of aluminum wires to the copper pads on printed circuit boards is that a gold layer must be present on the copper surface for high yield and a long-lived bond.

Since the conductor pattern on a printed circuit board is formed by etching a copper foil which is attached to the substrate insulating sheet, this means that the gold layer must be originally applied to the entire printed circuit board surface. It is possible to recover at least some of the gold from the etchant but these steps add cost to the process. In any case, gold remains on the exterior surface of the entire conductor pattern, creating added material cost of the final printed circuit board. Accordingly, there is economic motivation to omit the gold plating on copper surfaces preparatory for wedge bonding aluminum wires to them if bond quality does not suffer.

Mechanical protection of the microcircuit and the connections to it is usually provided by encapsulating or enclosing the entire die and surrounding board with a self-hardening liquid, typically either silicone or epoxy, see the Guidelines, p. 33. Such encapsulation provides excellent protection against mechanical damage and particulate contamination. And while these materials are not completely hermetic, they do limit substantially the amount of air and water vapor which can reach the individual connections between the printed circuit board and the circuitry on the die itself.

To summarize, the apparent present state of the art regarding the processes used for bonding aluminum wire to a copper surface such as in the COB chip mounting process, is to plate a nickel layer on the copper surface, plate a gold layer on the nickel layer, and then wedge bond the aluminum wire to the gold layer surface.

BRIEF DESCRIPTION OF THE INVENTION

I have discovered a variant of the conventional COB process in which the steps creating the gold and nickel layers on the copper preparatory to the aluminum wire to copper pad bonding step are eliminated. Ultrasonically bonding the aluminum wire directly to copper without previously forming nickel and gold layers appears to produce excellent bonds if certain changes are made to the conventional process. The variant process as I presently practice it involves the combination of specific types of materials and specific process steps which are widely used in the production of printed circuit board assemblies. The parts of the COB process which appear to be critical in implementing this disclosure's invention are the selection of the board material, the values of certain parameters in the ultrasonic wedge bonding step for forming the bond between the aluminum wire and the copper connection pad, cleanliness of the copper connection pad, and the materials used in the microcircuit protection step. There appears to be a relationship between the coefficient of thermal expansion (CTE) of the printed circuit board and the microcircuit encapsulant materials used in the ability to reliably form acceptable bonds between an aluminum wire and a bare copper connection pad.

For the laminate of the printed circuit board I use a laminate of a conventional organic material. In the process as presently practiced, I prefer to use the CEM material called CEM-1, which has a CTE of $14$–$20 \times 10^{-6}$ cm/cm/C. Based on preliminary tests, I believe that 100% epoxy mat laminate material, i.e. FR-4 (CTE=$12 \times 10^{-6}$ cm/cm/C) will also be successful. I believe that other materials of which printed circuit boards are commonly comprised, which have a CTE similar to that of CEM-1, and which are otherwise suitable may also be used successfully, although these have not been tested by me. I prefer CEM-1 because it is suitable for the intended application and is less expensive than suitable alternatives.

I use conventional wedge bonding apparatus with some of the settings and adjustments different from the default levels to form the bond between the aluminum wire and the copper connection pad.

For protecting the microcircuit and its connections to the printed circuit board, I have found that particular types of "high purity, low stress liquid encapsulant" resin materials (hereafter "low stress materials") as they are generically termed, appear to be helpful in eliminating the need for the nickel and gold layers in the AWBC process. After hardening, these encapsulants have a nominal CTE of approximately 15 (22 maximum)$\times 10^{-6}$ cm/cm/°C., which is substantially lower than the value of approximately $29 \times 10^{-6}$ cm/cm/°C. for other encapsulants now commonly in use. Particular encapsulants of this type whose use is known by me to successfully allow elimination of the gold and nickel layers are commercially available from The Dexter Corporation, Electronic Materials Div., 15051 East Don Julian Road, Industry, Calif. 91746 as encapsulants type Hysol FP4450, type Hysol FP4451, type Hysol FP4402, and type Hysol FP4650. The process as it is presently practiced uses the FP4450 material. The specific CTE's for these low stress materials are

| | |
|---|---|
| FP4402 | 19 (22 maximum) × $10^{-6}$ cm/cm/°C. |
| FP4450, 51 | 15 (22 maximum) |
| FP4650 | 12 (15 maximum) |

At the present time, I believe that the characteristic or characteristics of low stress materials which permits the nickel and gold layers to be eliminated for the most part arises from the fact that the hardened resin which low stress materials form has a CTE very close to that of the CEM-1 board material which I prefer. I believe that similar CTE's reduce the mechanical stress on the bond arising from thermal cycling. A second characteristic, only theoretical at this time, which may be related is that low stress encapsulant materials may have an elastic modulus substantially different from that of CEM-1. I speculate that other types of encapsulants now in use may have an elastic modulus closer to that of CEM-1. It is possible that if one of the materials has a very low elastic modulus, temperature changes in the stiffer material creates less stress at the bond site. A third characteristic, also theoretical at this point, which may also be a factor in the ability to eliminate the gold and nickel layers is that low stress materials may limit the chemical or metallurgical deterioration of the wire bond. Another possible explanation of the phenomenon at work here is that the CTE of the low stress materials simply matches the CTE of aluminum ($22 \times 10^{-6}$ cm/cm/°C.) better than other encapsulants presently in use. The low stress materials may have greater dimensional stability during hardening than other encapsulant materials. It may simply be that the lower CTE of low stress encapsulant materials reduces the stress on the individual bonds. Yet another possible cause is that the low stress materials form a stronger bond to the printed circuit board than do other materials. It may be that more than one of these characteristics are essential and that the low stress materials have each of those characteristics necessary. Or there may even be a necessary characteristic of which I am presently unaware. At any rate I have found the use of CEM-1 or FR-4 board material along with low stress encapsulant materials eliminates the need for gold and nickel layers on copper circuit board conductors. I believe the industry is generally unaware of this opportunity to reduce the cost of the assembled circuit.

A circuit board assembly incorporating my invention has a CEM-1 or other laminate formed of organic material and having a predetermined CTE. A bare copper foil is attached to a surface of the board, from which the on-board conductors are formed. A microcircuit element, typically carried on a die, is mounted on the surface of the printed circuit board adjacent to a surface of the bare copper foil. At least one (typically, many more than one) aluminum wire is electrically connected to connection pads on both the microcircuit and the copper foil. There is a bare bonding site on the copper foil for each aluminum wire, to which the aluminum wire is mechanically and electrically connected, typically by ultrasonic bonding. A volume of rigid encapsulant material is bonded to the printed circuit board and encloses and envelops the microcircuit element, the aluminum wire, and the bonding site. The printed circuit board laminate and the encapsulant material have similar CTE's.

DESCRIPTION OF THE PREFERRED EMBODIMENTS

Figure 1:
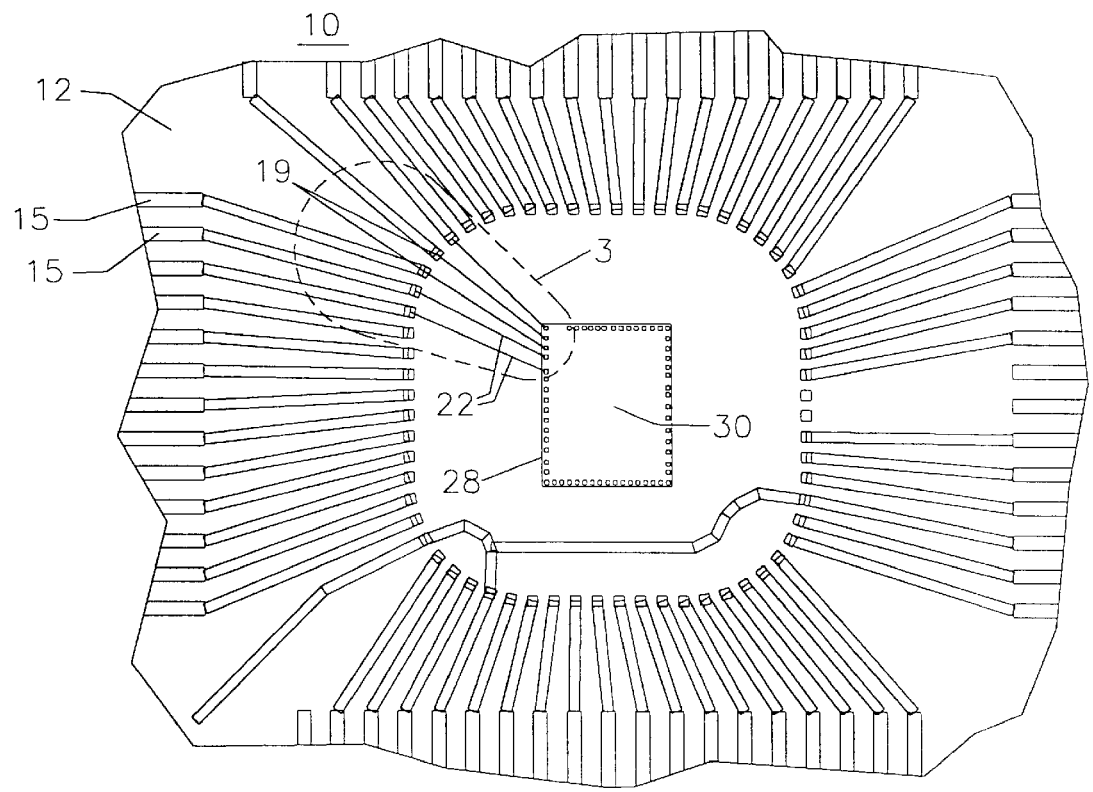
FIG. 1 is a plan view of a portion of a partially completed printed circuit board assembly showing a single microcircuit mounted thereon and electrically connected to the copper foil thereon, and before the encapsulation step.
Figure 2:
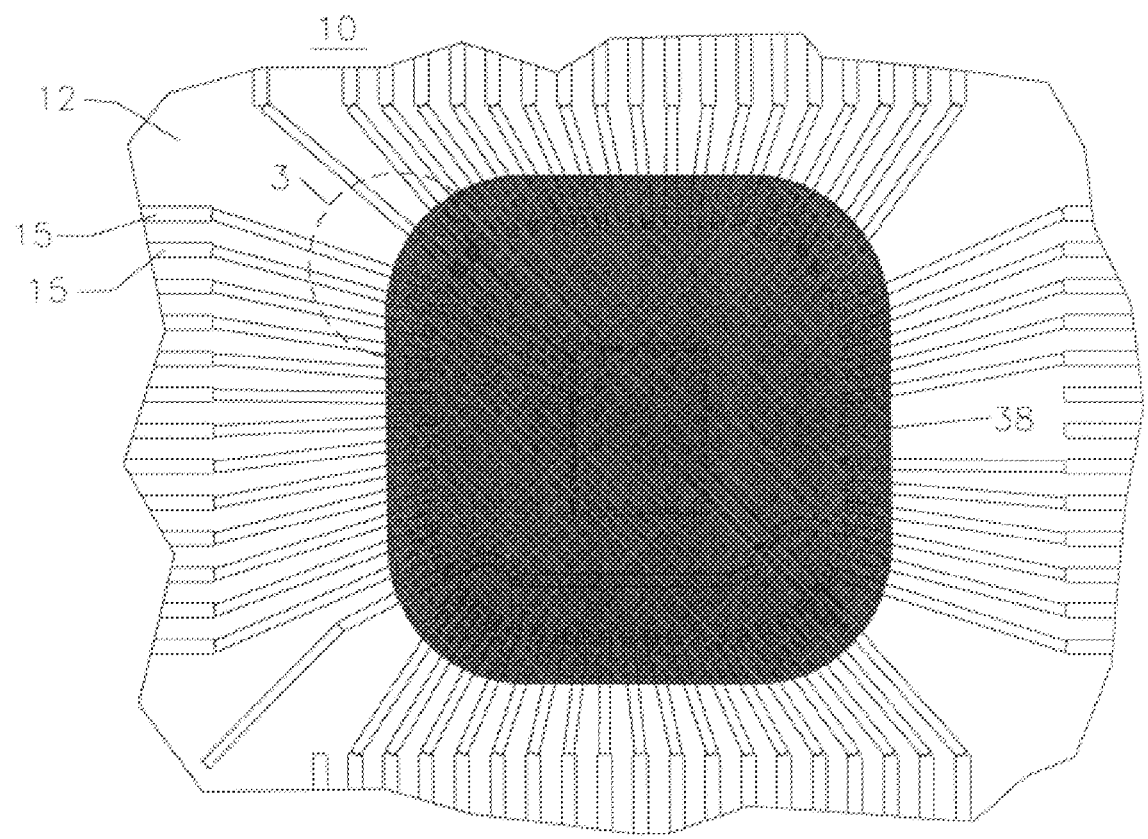
FIG. 2 is a plan view of a completed printed circuit board assembly with only the encapsulant visible.
Figure 3:
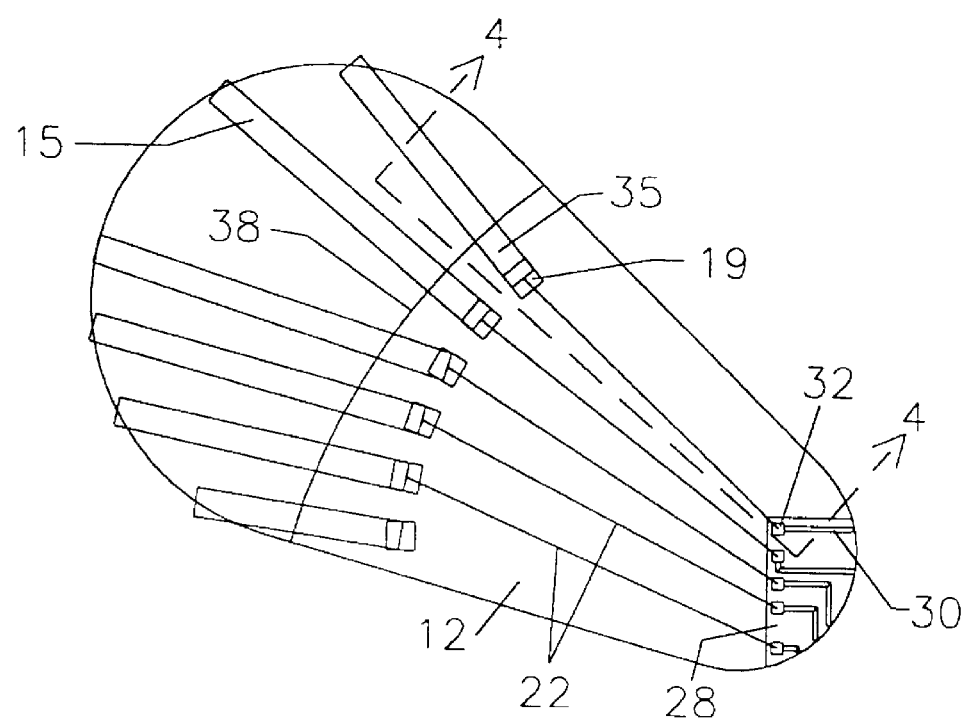
FIG. 3 is a magnified view of a portion of FIG. 1.

FIGS. 1 and 2 show a portion of a commercial version of a conventional printed circuit board assembly 10 in partly complete and final form respectively. FIG. 3 is a magnified view of a portion of assembly 10 indicated by ref. no. 3. and in which the invention is shown in more detail. A laminate board 12 made of an organic material carries bare copper foil conductive paths 15 on a first surface thereof. The board 12 is preferably made of cellulose epoxy mat (CEM-1) material if only one side of the board is to have circuit paths. I believe that in the situations where both sides of circuit board 12 have circuit paths then the required more expensive 100% epoxy mat (FR-4) material can be used in practicing my invention. Paths 15 provide the electrical connections between the various electrical components and to the terminals by which the circuit which the components form are connected to off-board conductors.

A microcircuit 30 itself is carried on a silicon die 28 having a bottom surface by which die 28 is attached with a bonding agent to the first surface of board 12. A top surface of die 28 carries the microcircuit 30 which has a plurality of connection pads 32 (see FIG. 3) around the periphery of die 28. The details of microcircuit 30 have been omitted from FIG. 1 but are entirely conventional. Connection pads 32 are usually formed of aluminum. Bare dies 28 carrying microcircuits 30 are available in quantities of any size from most of the large microcircuit manufacturers.

A plurality of aluminum wires 22 form connections from die connection pads 32 of microcircuit 30 to the board connection pads 19 forming a part of paths 15. To avoid cluttering FIGS. 1 and 2, only a few of these wires 22 are shown, but the reader should understand that in most assemblies 10 there is a wire 22 connected between each die connection pad 32 and a corresponding copper connection pad 19. These connections are formed by first wedge bonding 1.25 mil (0.032 mm) aluminum wire 22 onto each of the connection pads 32 and then onto its associated board connection pad 19. Board 12 should be prepared with a short rinse of either ENTEK Micro-Etch ME-1020, or with 100 F (37.5 C) 1% sulfuric acid with 85 gms/liter sodium persulfate before the die 28 is mounted. Each of the board connection pads 19 has a bare copper surface to which the bond is made. The wire is used as it comes off the spool and appears to need no special treatment.

After all of the wires 22 have been bonded into place a dam is placed on the laminate 12 completely encircling all of the individual connection pads 19. Liquid low stress material is poured or injected into the space enclosed by the dam. The low stress material hardens over a period of a few hours to form, in combination with the dam, the encapsulant 38 shown in FIG. 2. The reader should understand that in actuality the preferred materials for the encapsulant 38 of a completed assembly 10 is totally opaque after hardening, and circuit features within it cannot be seen by the naked eye. Each of the wires 22, each of the connection pads 19 and 32, and the die 28 are all completely embedded in the encapsulant 38 and protected from damage and contamination. There is in the preferred embodiment about a 30 mil (0.76 mm) thickness of encapsulant 38 above die 28. There should be a thickness of at least 20 mil (0.51 mm) of encapsulant 38 above the feature of the encapsulated components projecting farthest above the surface of laminate 12. A preferred embodiment has the periphery of encapsulant 38 following approximately the shape defined by the individual board connection pads 19, and hence is "squarish" with large radii on the corners. I do not believe the actual shape of encapsulant 38 is critical so long as every one of the board connection pads 19 as well as the space within them are completely surrounded by encapsulant 38 to a depth of at least 20 mil.

Figure 4:
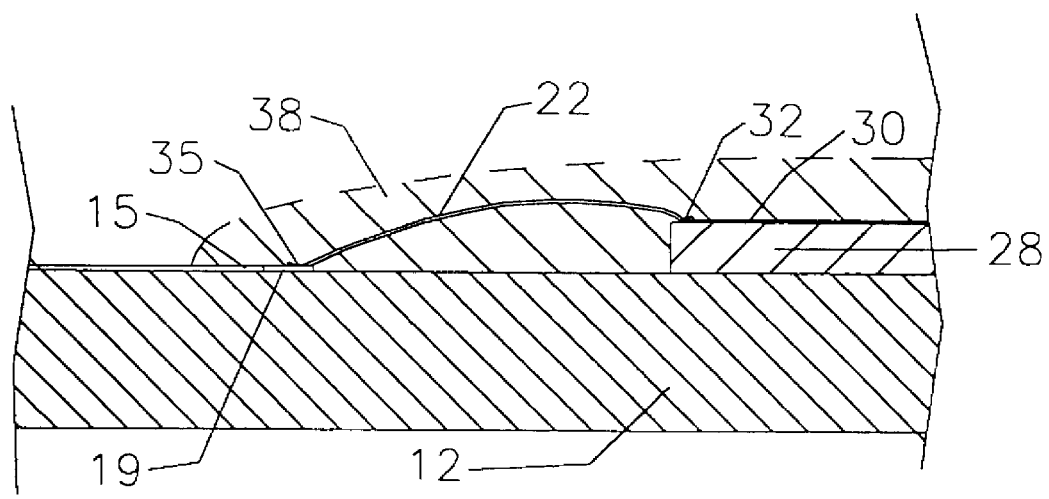
FIG. 4 is a cross section view of the portion of the microcircuit and the printed circuit board on which it is mounted, shown in FIG. 3.

FIG. 4 shows in magnified cross section a typical connection between a connection pad 32 and a connection pad 19 and as illustrated in FIG. 3. The encapsulant 38 is shown in dotted outline to illustrate its shape and position after applying to the printed circuit board. The actual aluminum wire to copper pad bond site is present at 35. I find that such bonds made according to the following detailed specification are of quality equal to those made between a gold layer on the copper connection pad and the aluminum wire 22. It is very likely that most of these specific dimensions and other parameter values are not critical, but fall within accepted ranges for the particular dimension or other value. Those dimensions and values which may be critical to the quality of the bond are identified as such.

| Laminate 12: | |
| --- | --- |
| Material | CEM-1 |
| Thickness | 62 mil (1.57 mm) |
| Connection pad 19 thickness | 2.4 mil (.061 mm) nominal |
| Connection pad 19 width | 12 mil (.3 mm) |
| Connection pad 19 material | Standard bare circuit board copper foil |
| Preparation | Short rinse with either ENTEK Micro-Etch ME-1020, or with 100 F. (37.5 C.) 1% sulfuric acid with 85 gms/liter sodium persulfate |
| Die: | |
| Material | Standard IC silicon |
| Thickness | 20 mil (.51 mm) nominal |
| Length | 180 mil (4.6 mm) nominal |
| Width | 140 mil (3.6 mm) nominal |
| Wire: | |
| Material | 99% Al, 1% Si |
| Diameter | 1.25 mil (.032 mm) |
| Length | 150 mil (3.8 mm) nominal |
| Elongation | 1–4% |
| Tensile strength | 19–21 gm |
| Preparation | As purchased |
| Encapsulant: | |
| Type (from Dexter-Hysol) | Hysol FP4450, Hysol FP4402, or Hysol FP4650 |
| Thickness | 50 mil (1.27 mm) nominal |
| Maximum dimension in plane | 0.5–.55 in (12.7–14 mm) nominal |

The ENTEK cleaning fluid is available from Enthone-OMI, PO Box 1900, New Haven, Conn. 06508. It is a commonly used material for connection pad cleaning as is the sulfuric acid solution.

Bonding was performed with a standard wire bonding unit. The unit used is available from Kulicke & Soffa, 2102 Blair Mill Rd., Willow Grove, Pa. 19090 as Model No. 1470. The ultrasonic generator unit is also provided by Kulicke & Soffa as Model No. 4320A, having a 60 KHZ output. The bonding tool, available from Micro-Swiss div. of Kulicke & Soffa, is made of tungsten carbide and is described as a "wedge/concave-matte" by Micro-Swiss.

There are a number of operator-settable parameters associated with this, or any wire bonding unit. Those settings for attaching the wire 22 to the die 28 connection pads 32 do not affect the quality of the bond to the copper connection pads 19. Those settings for attaching the aluminum wires 22 to the copper connection pads 19 are provided with as much detail as possible in order to allow the process of my invention to be replicated by the public. The "pulse" parameter is a standard value associated with movement of the bonding tool. The wire bonding unit has internally programmed default parameter values; some of the preferred parameter values differ somewhat from the default values.

| Parameter | Al—Cu bond - actual (default) |
| --- | --- |
| Tool inflection point (TIP) | 20 (16) pulses |
| Contact velocity (CVL) | 8 (3) within permitted range 1–255, where 1 is fastest |
| Overtravel (OVT) | 6 (5) pulses |
| Bond time (BTM) | 30–40 (40) msec |
| Power setting | 2.8–3.8 (2.0) indicated dial gradations |
| Bond force | 25–30 gm |

The bond time, power, and overtravel settings may all be critical values in accomplishing satisfactory bonds. The power setting on the Kulicke & Soffa Model No. 4320A ultrasonic generator is controlled by a dial whose scale indicates settings from 1 to 10. The spectral power value range which corresponds is not available. It may be necessary to experiment briefly in order to determine an appropriate power setting. The bond time is specified in msec. The overtravel and other settings are specified as pulses, for which numerical values are entered into the controller of the Kulicke & Soffa Model No. 1470 bonding machine.

Loop height and clamp closed position parameters apply only to the first bond, made to die connection pads 32. These probably do not affect the aluminum to copper bond on connection pads 19.

The preceding has described my invention and a preferred means for its practice.

What I desire to protect and claim by letters patent as my invention is:

1. A circuit board assembly of the type incorporating a cellulose epoxy mat printed circuit board; a bare copper foil attached to a surface of the board; a microcircuit element mounted on the surface of the printed circuit board adjacent to a surface of the bare copper foil; at least one aluminum wire electrically connected to the microcircuit; a wedge bonding site on the copper foil mechanically and electrically connecting the aluminum wire directly to the bare copper foil; and a volume of rigid encapsulant material bonded to the printed circuit board and enveloping the microcircuit element, the aluminum wire, and the bonding site, said aluminum wire, printed circuit board, and encapsulant material all having similar coefficients of thermal expansion.

2. The circuit assembly of claim 1, wherein the encapsulant material comprises a low stress material.

3. The circuit assembly of claim 2, wherein the encapsulant material comprises one of Dexter Hysol encapsulant type FP4402, type FP4450, and type FP4650.

4. The circuit assembly of claim 3, wherein the printed circuit board material comprises a material selected from CEM-1 and FR-4 materials.

5. The circuit assembly of claim 1, wherein the printed circuit board material comprises a material selected from CEM-1 and FR-4 materials.

6. A circuit board assembly of the type incorporating an organic material printed circuit board; a bare, etched copper foil attached to a surface of the board; at least one aluminum wire electrically and mechanically connected directly to the bare copper foil at a wedge bonding site; and a volume of rigid encapsulant material bonded to the printed circuit board and enveloping the aluminum wire and bonding site, said aluminum wire, printed circuit board, and encapsulant material all having similar coefficients of thermal expansion.

7. The circuit assembly of claim 6, wherein the encapsulant material comprises low stress material.

8. The circuit assembly of claim 7, wherein the encapsulant material comprises one of Dexter Hysol encapsulant type FP4402, type FP4450, and type FP4650.

\* \* \* \* \*

UNITED STATES PATENT AND TRADEMARK OFFICE
CERTIFICATE OF CORRECTION

PATENT NO: 5,771,157

DATED: June 23, 1998

INVENTOR(S): Robert L. Zak

It is certified that error appears in the above-identified patent and that said Letters Patent is hereby corrected as shown below:

Claim 1, line 13, delete "similar".

Claim 1, line 13, after "expansion." insert -- falling approximately within the range of $12 - 22.4 \times 10^{-6}$ cm/cm/°C.--

Claim 6, column 9, line 7, delete "similar".

Claim 6, column 9, line 7, after "expansion." insert -- falling approximately within the range of $12 - 22.4 \times 10^{-6}$ cm/cm/°C.--

Signed and Sealed this

Ninth Day of February, 1999

Attest:

Attesting Officer

*Acting Commissioner of Patents and Trademarks*